United States Patent [19]

Turner

[11] 4,090,064
[45] May 16, 1978

[54] ELECTRONIC THERMOMETER DECODER AND DISPLAY SYSTEM

[75] Inventor: Robert B. Turner, Weymouth, Mass.

[73] Assignee: Johnson & Johnson, New Brunswick, N.J.

[21] Appl. No.: 758,620

[22] Filed: Jan. 12, 1977

[51] Int. Cl.² .................. H03K 21/22; G06M 3/08
[52] U.S. Cl. ..................... 235/92 MT; 235/92 T; 235/92 EA; 235/92 R
[58] Field of Search .......... 235/92 T, 92 MT, 92 TF, 235/92 EA; 73/343.5, 362 R, 362 AR

[56] References Cited

U.S. PATENT DOCUMENTS

| | | | |
|---|---|---|---|
| 3,834,238 | 9/1974 | Mueller et al. | 235/92 MT |
| 3,872,728 | 3/1975 | Joyce et al. | 235/92 MT |
| 3,940,595 | 2/1976 | Turner | 235/92 T |

Primary Examiner—Joseph M. Thesz

[57] ABSTRACT

In an electronic thermometer system for measuring and displaying temperature including a counter for counting pulses representative of the temperature measured; a first display device; a second display device; and a count modifying circuit responsive to a first predetermined count in the counter for indicating a first modified preestablished count for display by the first display device and responsive to a second predetermined count in the counter for indicating a second modified preestablished count for display by the first display device and a third modified preestablished count for display by the second display device.

7 Claims, 4 Drawing Figures

ELECTRONIC THERMOMETER DECODER AND DISPLAY SYSTEM

FIELD OF INVENTION

This invention relates to a simplified counting and decoding circuit for enabling display of a count in a number of powers using fewer than that number of counters, and more particularly such a circuit for use in an electronic thermometer system which displays temperature or time and temperature.

BACKGROUND OF INVENTION

Electronic thermometers are becoming increasingly more attractive as their cost decreases. Although their initial cost may be relatively high, the cost over their extended period of use is comparable to that of mercury thermometers, especially when the electronic thermometers are used with disposable probe covers and the cost of repeated sterilization and breakage allowances for mercury thermometers is considered. Some electronic thermometers employ circuitry similar to digital volt meters which is neither the best suited nor most inexpensive approach for implementing thermometer systems. Thermometer systems, especially those used in patient care, require only limited range capability which admits of much simplification relative to broader range systems and renders redundant many circuits used in such instances.

Recent advances, U.S. Pat. No. 3,940,595, have achieved a measure of success in reducing the number of counters and reducing costs. However, the substituted structure is still fairly complex and expensive.

SUMMARY OF INVENTION

It is therefore an object of this invention to provide an improved, even more simplified counting and decoding circuit for enabling display of a count in a number of powers using less than that number of counters.

It is a further object of this invention to provide such a circuit for use in an electronic thermometer system for displaying temperature or time and temperature.

The invention results from the realization that in the limited range of use of thermometers for clinical and medical use a simplified logic circuit could be used to respond to one counter to set the necessary range of numbers in two displays.

The invention features an electronic thermometer system for measuring and displaying temperature. It includes a counter for counting pulses representative of the temperature measured, a first display device, and a second display device. A count modifying circuit responsive to a first predetermined count in the counter indicates a first modified preestablished count for display by the first display device. In response to an additional count in the counter the count modifying circuit presents a second modified preestablished count for display by the first display device and a third modified preestablished count for display by the second display device.

The counter may produce a binary coded decimal output. The count modifying circuit may include means for directly connecting the zero order output of the counter to the zero order output of the first display device and in addition to an AND circuit. The exclusive-OR circuit has one input connected to the first order output of the counter and its output connected to the first order input of the first display device. The AND circuit has one input connected to the zero order output and the other input connected to the first order output of the counter and its output connected to the third order input of the first display device and to the second input of the exclusive-OR circuit. The second order input of the first display device is set permanently to binary zero. Means directly connect the second order output of the counter to the second display device.

In an electronic thermometer system which displays time in a time mode period and temperature in a temperature mode period the first predetermined count in the counter may be the last time count and the third modified preestablished count may be the low range temperature count. The second predetermined count may be the additional count accumulated by virtue of the pulses which represent temperature and the second and third modified and preestablished counts resulting therefrom may be temperature counts.

DISCLOSURE OF PREFERRED EMBODIMENT

Other objects, features and advantages will occur from the following description of a preferred embodiment and the accompanying drawings, in which.

The invention may be accomplished in an electronic thermometer system for measuring and displaying temperature which includes a counter for counting pulses representative of the temperature measured, a first display device, and a second display device. There is a count modifying circuit which, in an electronic thermometer system that measures and displays time and temperature, responds to the last time count in the counter to indicate a first modified preestablished temperature count for display by the first display device and in response to an additional count in the counter indicates a second modified preestablished temperature count for display by the first display device and a third modified preestablished temperature count for display by the second display device. For example, consider a thermometer which in its time mode period displays the time for 30 seconds and in the temperature mode period covers the range from 90° F to 110° F. When the counter is at "3" the count modifying circuit immediately responds to produce the first modified preestablished temperature count of "9" for display by the first display device. Assuming that the temperature measuring portion of the circuit provides zero pulses at 90° F, 1000 pulses at 100° F, and 2000 pulses at 110° F, the "9" displayed by virtue of the response of the count modifying circuit to the "3" in the counter is proper until the count of 1000 pulses has been reached; at this point the count in the counter shifts. There is an additional count in the counter; that is, it has shifted from "3" to "4". In response to the "4" in the counter the count modifying circuit immediately responds by putting a "0" in the first display and a "1" in the second display so the thermometer can now present a temperature in the upper half of its range, i.e. from 100.0° F to 109.9° F. If the count goes to the full 110° F, the assumed upper limit in this example, then the modifying circuit maintains the "1" in the second display device and changes its presentation to the first display device from a "0" to a "1" so that those two displays now read "11" indicating 110° F.

Figure 1:
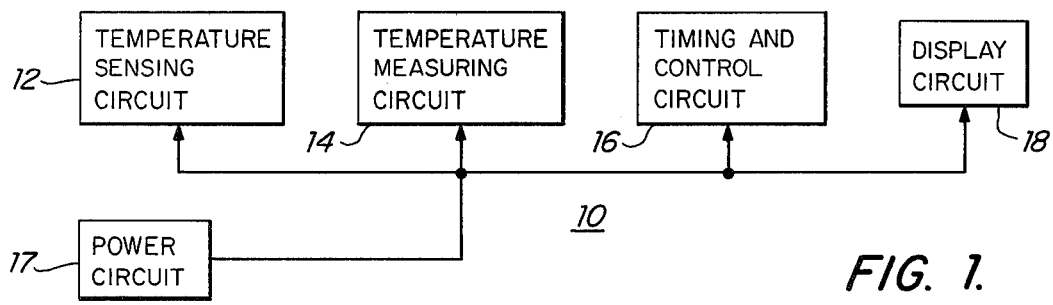
FIG. 1 is a simplified block diagram of an electronic thermometer system using a counting and display circuit according to this invention.

There is shown in FIG. 1 an electronic thermometer system 10 according to this invention including a temperature sensing circuit 12 which senses variation in temperature and provides a signal representative thereof to temperature measuring circuit 14 which provides a signal representative of the temperature sensed to timing and control circuit 16. Timing and control circuit 16 establishes an operation interval including a time mode period and a temperature mode period during which the time and temperature are displayed by display circuit 18. Timing and control circuit 16 generates pulses for measuring a fixed period of time during the time mode period and selectively provides at its output either those pulses during the time mode period or the signal measuring the sensed temperature during the temperature mode period. Power is provided to each of circuits 12, 14, 16 and 18 by power circuit 17.

Figure 2:
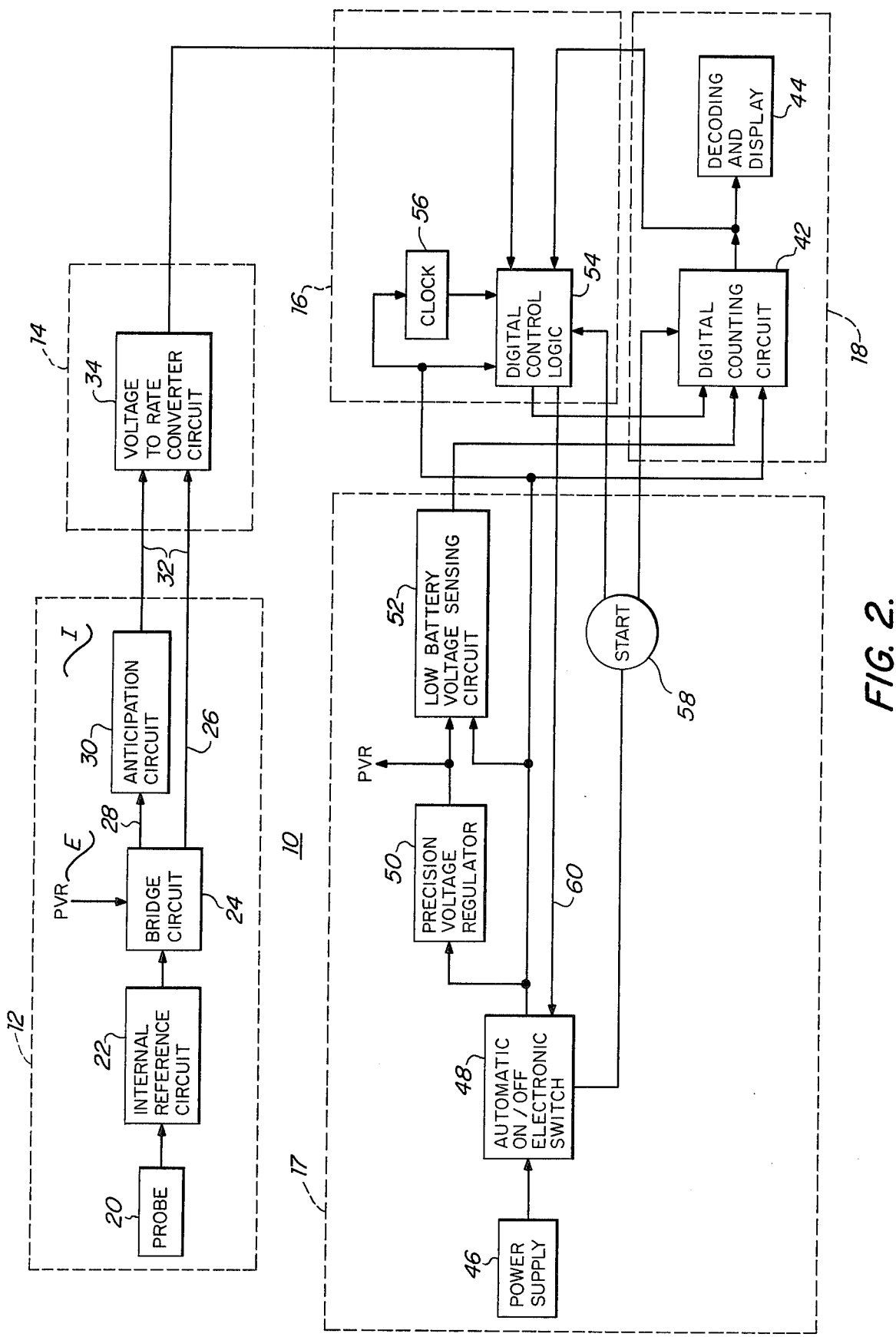
FIG. 2 is a more detailed block diagram of the system of FIG. 1.

In one specific embodiment temperature sensing circuit 12 may include a probe 20, FIG. 2, for sensing a temperature to be measured and producing an analog signal representative thereof which is submitted through internal reference circuit 22 to bridge circuit 24. Internal reference circuit 22 selectively connects a matching circuit to bridge circuit 24 in place of the input from probe 20 so that the accuracy and operation of the system can be verified. Bridge circuit 24 provides a reference output on line 26 and on line 28 provides a varying output as a function of the bridge imbalance representing the analog signal which is a function of the temperature sensed by probe 20. In this system used primarily to take the temperature of humans the measurement range is from 90° F to 110° F. Thus reference output 26 of bridge circuit 24 represents the level of 90° F; when output 28 of bridge circuit 24 is equal to reference output 26 thermometer probe 20 is measuring a temperature of 90° F. When output 28 is at a predetermined deviation from the level of output 26 probe 20 is measuring 110° F. Output 28 is fed to anticipation circuit 30 which senses the rate of change of the temperature being sensed by probe 20 and adds to the signal on output 28 from bridge circuit 24, thereby providing a signal on line 32 in measuring circuit 14 representative of the final value of the temperature being sensed in advance of the actual sensing of that final value.

In measuring circuit 14 the signal on line 32 is directed to voltage to rate converter circuit 34 whose other input receives reference output 26 from bridge circuit 24. A difference between line 32 and reference output 26 at the input to circuit 34 produces a pulse having fixed width and fixed amplitude. The greater the difference between these two inputs to circuit 34 the higher will be the repetition rate of the pulses provided at its output and this repetition rate is proportional to the temperature being sensed by probe 20.

Control and display circuit 18 includes digital counting circuit 42 which counts the digital pulses provided at the output of voltage to rate converter circuit 34 and delivers that count to digital display 44 which decodes and displays the measured temperature.

All power to the system from power supply 46 is controlled by automatic on-off switch 48 which is turned on by actuation of start switch 58 and remains on independently of further operation of switch 58 until the operation interval including the time mode and temperature mode periods has ended and then automatically turns off. Precision voltage regulator 50 provides regulated voltage, PVR, to bridge circuit 24, voltage to rate converter circuit 34, and low battery voltage sensing circuit 52. The other input to low battery voltage sensing circuit 52 is the unregulated power supplied at the output of automatic on-off electronic switch 48. When the unregulated power supply voltage decreases to a predetermined level relative to the regulated voltage output provided by precision voltage regulator 50, low battery voltage sensing circuit 52 provides a signal to digital counting circuit 42 causing it to extinguish the least significant digit of the temperature appearing in decoding and display 44.

Electronic thermometer system 10 operates in two modes: a time mode and a temperature mode. Digital control logic 54 supervises system performance in each of these modes and controls the transition between them. In the time mode digital control logic 54 passes time measuring pulses from clock 56 to digital counting circuit 42, while in the temperature mode digital control logic 54 directs temperature measuring pulses from voltage to rate converter circuit 34 to digital counting circuit 42. The system is operated by actuation of start switch 58.

In operation when start switch 58 is actuated automatic on-off electronic switch 48 is turned on to supply power from power supply 46 to the rest of the system and digital control logic 54 and digital counting circuits 42 are reset. Probe 20 in contact with the patient whose temperature is to be measured begins to sense the temperature. The voltage E at output 28 of bridge circuit 24 decreases. The difference in levels of output 26 and output 32 causes pulses to be generated at a repetition rate representing the final value of the temperature being sensed. This time may be reduced still further by the use of anticipation circuit 30 as explained previously.

Simultaneously with this action, upon the actuation of start switch 58, automatic on-off electronic switch 48 is latched to sustain automatic on-off switch 48 in the on condition during the time and temperature mode periods. In this particular embodiment, the time mode period precedes the temperature mode period and their durations are typically 30 seconds and 10 seconds, respectively. Simultaneously with the actuation of start switch 58 digital control logic 54 passes clock pulses from clock 56 to digital counting circuit 42. These clock pulses may have a duration of 100 milliseconds so that a count of 10 such clock pulses by digital counting circuit 42 indicates 1 second. At the end of each second so accumulated decoding and display 44 is enabled to display the numbers "1" through "29" representing the time. Then digital control logic 54 transfers the system into the temperature mode by permitting passage, for the period of one clock pulse, of the pulses at the output of voltage to rate converter circuit 34 to digital counting circuit 42 which accumulates the count and causes the temperature to be displayed. The temperature display period is 10 seconds, after which a signal on line 60 from digital control logic 54 turns off automatic on-off electronic switch 48.

Figure 3:
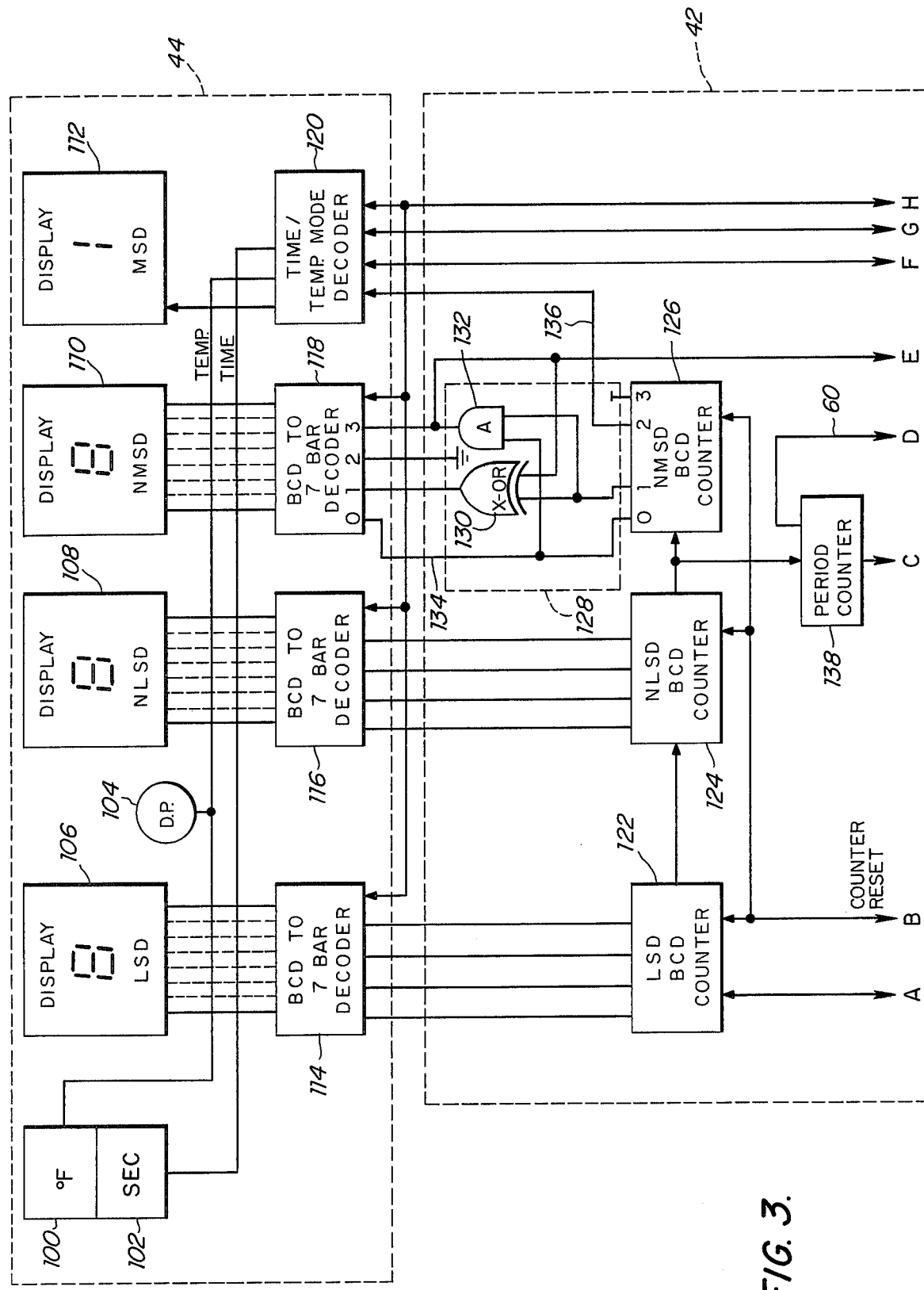
FIG. 3 is a more detailed block diagram of the counting circuit and decoding and display circuit of FIG. 2.

Digital decoding and display circuit 44, FIG. 3, includes a °F display 100, a second (SEC) display 102, a decimal point display 104 connected with °F 100 and four digit position displays, least significant digit display 106, next to least significant digit display 108, next most significant digit display 110, and most significant digit display 112. The most significant digit display 112 has but two bars as it will only display a "1" or be blank while the other three displays contain full seven-bar displays which can portray any digit. Also included in the decoding and display circuit 44 are three binary coded decimal to seven-bar decoders 114, 116, 118, and a time and temperature mode decoder 120. These four decoders and displays are driven by three counters in digital counting circuit 42, least significant digit counter 122, next to least significant digit counter 124, and next most significant digit counter 126. Counters 122 and 124 are connected directly to their corresponding decoders 114 and 116. Counter 126 is interconnected with decoders 118 and 120 through count modifying circuit 128 which includes an exclusive-OR gate 130 and an AND gate 132, a direct connection, line 134, between the zero power or order output of counter 126 and the zero power or order input of decoder 118, and a direct connection, line 136, between the second order output of counter 126 and decoder 120. AND gate 132 receives an input from the zero order and the one order output of counter 126 and has its output connected to the third order input of decoder 118. Exclusive-OR gate 130 receives one input from the first order output of counter 126 and the other input from the output of AND gate 132 and provides its output to the first order input of decoder 118. The third order output of counter 126 is not used and the second order input to decoder 118 is maintained in the low state. Period counter 138 is unresponsive during the time mode period but responds to carry signals from counter 124 during the temperature mode period and subsequent periods of operation. During the time mode period the counts in counters 122, 124, and 126 which appear in decoders 114, 116, and 118 are immediately displayed in displays 106, 108, 110, and 112 while the second display 102 is lighted. Typically, the least significant digit 106 and decimal point display 104 are not used in the time mode period, nor is the most significant digit display 112, the time, from 1 to 29 seconds being displayed only in displays 108 and 110. Counts are delivered to the least significant digit counter 122 on line A and counters 122, 124, and 126 are reset by a signal on line B. Counter 138 is both reset and inhibited by signals on line C and provides an output at D on line 60 to the automatic on-off electronic switch 48 to cut off power to the system and cease operations. A signal is provided on line E from AND gate 132 when counter 126 has reached a count of "3" indicating that 30 seconds have elapsed and that the time mode period has ended. A signal on line G to decoder 120 at the beginning of operations lights the second, SEC, display 102. At the end of the time mode period the signal on line F ceases, the second, SEC, display 102 goes blank and the signal on line G at the beginning of the temperature mode period lights decimal point display 104 and ° F display 100. Also at the beginning of the temperature mode period a signal on line H latches each of the decoders 114, 116, 118, and 120 preventing them from further responding to counters 122, 124, and 126, thereby fixing the displayed temperature.

Digital control logic 54 includes time and temperature flip-flop 140 and latch/gate flip-flop 142, each of which has a Q output and a $\overline{Q}$ output which are in the high state when the flip-flop is set and reset, respectively. The inputs to flip-flops 140 and 142 include a reset input R which sets the flip-flop to the reset state, and a D input which when enabled prepares the flip-flop to be switched to the set state upon receipt of a signal at the clock input CL. Also included in digital control logic 54 is a flip-flop reset circuit 144 which may include AND gate 146, a counter reset circuit 148 which may include exclusive-OR gate 150, and a counting control circuit 152 which includes AND gates 154 and 156 and exclusive-OR gate 158 and a period counter reset and inhibit circuit 160 including OR gate 162.

Figure 4:
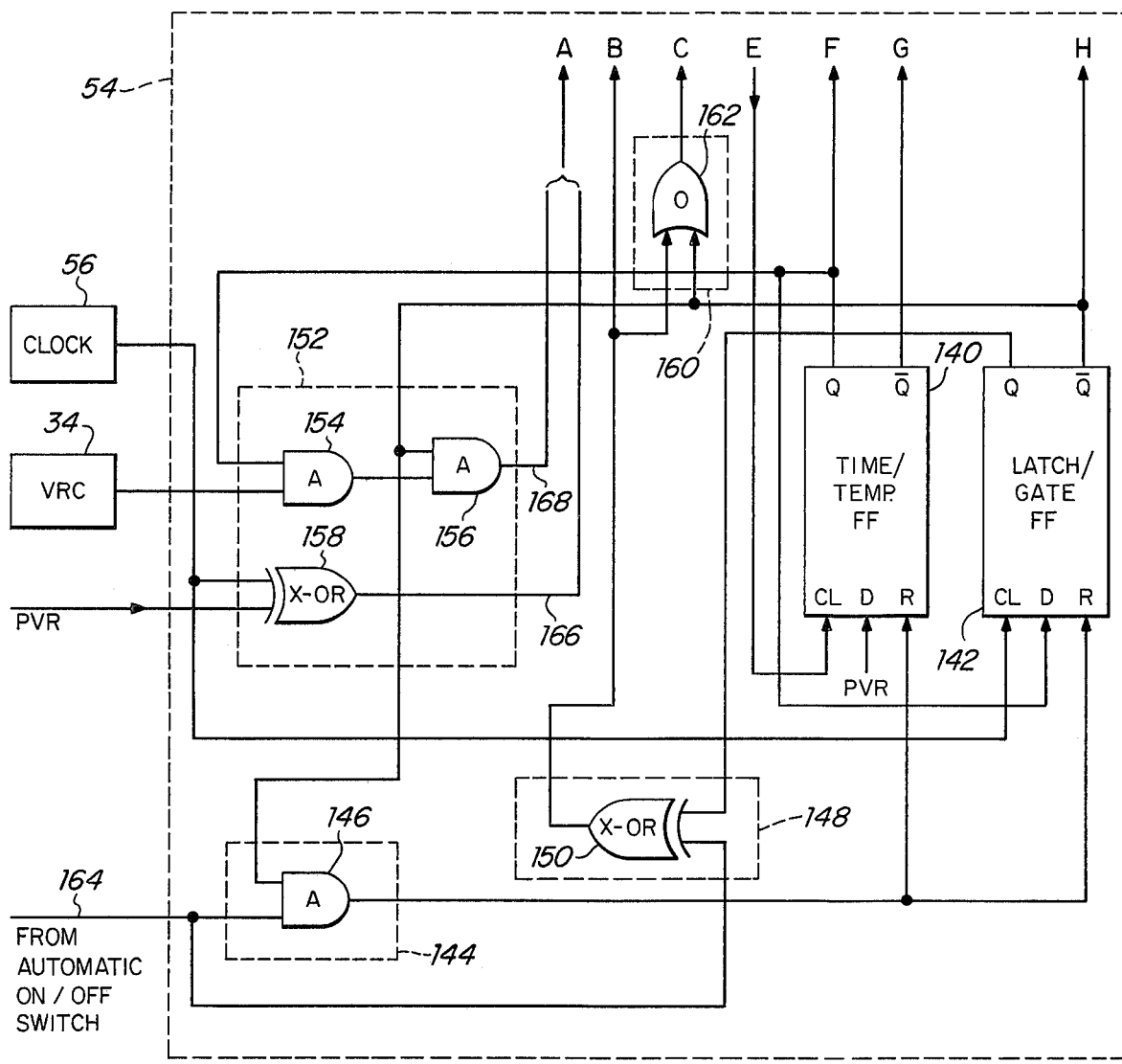
FIG. 4 is a more detailed block diagram of the digital control logic circuit in FIG. 2.

The circuits depicted in FIGS. 3 and 4 begin operation with the signal on line 164 from the automatic on-off switch to one input of AND gate 146. At this time flip-flops 140 and 142 are in the reset state so that their $\overline{Q}$ outputs are high. The other input to AND gate 146 from the $\overline{Q}$ output of flip-flop 142 is high and AND gate 146 provides a reset signal to definitively reset flip-flops 140 and 142. The signal on line 164 is also delivered to exclusive-OR gate 150 which provides a signal on line B which resets each of counters 122, 124, and 126. The signal on line B is also delivered to OR gate 162 which resets period counter 138. One-hundred-millisecond clock pulses from clock 56 are fed to one input of exclusive-OR gate 158 whose other input from the precision voltage regulator (PVR) is constantly in the high state thus exclusive-OR gate 158 has an output only during the one-hundred-millisecond interval between the clock pulses which it produces on line 166. When flip-flop 140 is reset its Q output is in the low state which causes the output of AND gate 154 to be low and likewise affect the output of AND gate 156 on line 168. Lines 166 and 168 considered jointly as line A are fed to counter 122. A signal on line 168 causes counter 122 to count the inverted clock pulses on line 166. The high output of $\overline{Q}$ on line G lights the second, SEC, display 102.

Each clock pulse counted by counter 122 is equivalent to a tenth of a second. On accumulation of 10 such pulses a carry signal is delivered to counter 124 which in turn provides an overflow at 10 seconds to counter 126. The overflow from counter 124 although delivered to period counter 138 is ineffective during this, the time mode period. Counting continues in this manner until counters 126, 124, and 122 contain the counts "2", "9"-"9", respectively, indicating that 29.9 seconds have elapsed. On the very next count counters 122 and 124 go to "0" and counter 126 goes to "3". This is the end of the time mode period and the beginning of the temperature mode period.

Count modifying circuit 128 reacts to the residual count of "3" left in counter 126 for providing an indication of the number "9" to decoder 118. This is accomplished as follows: the zero, first, second and third order outputs of counter 126 are now at "1", "1", "0", and "0", respectively. Thus there is a "1" on line 134 and a "1" to both inputs of AND gate 132 resulting in a "1" output from AND gate 132. Exclusive-OR gate 130 thus has both its inputs at a "1" resulting a "0" at its output. The second order output of counter 126 is at "0" thus the signal on line 136 to decoder 120 is ineffective. The second order input to decoder 118 is "0" thus the zero, first, second, and third order inputs to decoder 118 are registering respectively, "1", "0", "0", "1" or the equivalent of decimal "9", so that a "9" is displayed in the next to most significant digit display 110. When AND gate 132 output goes to a "1" there is a "1" provided on line E which is presented to the clock input, CL, of flip-flop 140. Since its D input is permanently enabled by the constantly present PVR input, flip-flop 140 immediately switches to the set state switching its $\overline{Q}$ output low at line G which energizes the second display 102; the Q output goes high on line F enabling decimal point display 104 and °F display 100. The Q output of flip-flop 140 is also used to enable the D input to flip-flop 142 and to provide a high input to AND gate 154 enabling it now to pass pulses from voltage to rage converter circuit 34 which are representative of the temperature being sensed. Voltage to rate converter circuit 34 is set so that at 90° F no pulses are delivered. At 100° F one thousand pulses are delivered and at 110° F two thousand pulses are delivered during the one-hundred-millisecond duration between clock pulses. With the one input to AND gate 156 enabled by the high state of the Q output of flip-flop 142, the voltage to rate converter circuit output pulses are passed through AND gate 154 and through AND gate 156 onto line 168, and the inverted clock pulses continue on line 166. These two outputs considered as line A cause counter 122 to count the number of pulses from the voltage to rate converter circuit 34 for one clock period of one-hundred-milliseconds. These pulses are counted by counters 122, 124, and 126 in the same fashion as with the time pulses. If the temperature is between 90.0° F and 99.9° F, the counts in counters 122 and 124 will be somewhere between 0.0 and 9.9 which in conjunction with the "9" already available for display 110 present a reading of "90.0" to "99.9". If however, the temperature sensed is more than 99.9° F, i.e. 100° F or more, the count goes beyond nine hundred and ninety nine to one thousand pulses and a carry is delivered from counter 124 to counter 126 changing the residual "3" in counter 126 to a "4" count. At this point the zero, first, second, and third order output in counter 126 switch to "0", "0", "1", and "0", respectively. This disables AND gate 132 and consequently disables exclusive-OR gate 130 whose input from AND gate 132 and from the first order output of counter 126 are both "0". The zero order output of counter 126 is fed directly on line 134 to the zero order input of decoder 118 so that the zero, first, second, and third order inputs to decoder 118 read respectively, "0", "0", "0", "0". However, the second order output of counter 126 is a "1" which, provided on line 136 to decoder 120, causes a "1" to appear in display 112 while a "0" appears in display 110, the transition from "99" to "100" having thereby been made. If the temperature goes over 109.9° F, 2000 counts have been accumulated and another carry moves from counter 124 to 126 switching the count therein to a count of "5" so that the output of counter 126 now reads "1", "0", "1", "0", thus the "1" on line 136 remains, keeping the "1" displayed in display 112. But the input to decoder 118 receives only the "1" on line 134 to its zero order input so that its inputs read "1", "0", "0", "0", equivalent to a decimal "1" which is then portrayed in display 110, producing a display of "110.0". This thermometer system, without modification of the circuits, can sense and measure up to 130° F: at 120° F, 3000 counts set a count of six in counter 126, which presents outputs "0", "1", "1", "0", from which modifying circuit 128 produces a "0", "1", "0", "0", to divider 118 and a "1" to decoder 120; at 130° F, 4000 counts set a count of seven in counter 126, which presents outputs "1", "1", "1", "O", from which modifying count 128 produces a "1", "1", "0", "0" to decoder 118 and a "1" to decoder 120.

All of this has occurred during the 100 millisecond interval between clock pulses. At the end of that clock pulse the signal to the clock input, CL, to flip-flop 142 finds the D input already enabled by the high Q output of flip-flop 140 and thus flip-flop 142 is switched to the set state. $\overline{Q}$ output of flip-flop 142 then goes low providing a signal on line H to latch each of the decoders 114, 116, 118, and 120 so that the count now available, representing the temperature is fixed and will be displayed in displays 106, 108, 110 and 112 regardless of any further action by counters 122, 124 and 126. The high state on output Q of 142 causes exclusive-OR gate 150 to reset counters 122, 124, and 126. The low state of the $\overline{Q}$ output of flip-flop 142 disables AND gate 156 causing its output on line 168 to go low so that the pulses from voltage to rate converter circuit 34 can no longer be counted but the inverted clock pulses on line 166 from exclusive-OR gate 158 will be counted. Once again, counter 122 counts the 100 millisecond pulses and at the end of each 10 such pulses provides a carry to counter 124 which continues for 9.9 seconds, subsequent to which, counter 124 overflows providing an output to period counter 138. Period counter 138 is now able to accumulate the counts since the inhibit signal at OR gate 162 from $\overline{Q}$ has gone low with the switching of flip-flop 142 to the set state. Period counter may accumulate one, two, or more of such carries from counter 124 signifying a temperature display period of 10 seconds, 20 seconds, or more, after which it provides a signal on line 60 at D which is delivered to the automatic on-off switch 48 to turn off the entire system. If start button 58 is reactivated before the signal on line 60 from period counter 138 occurs, the reset pulse developed on line 164 causes exclusive-OR gate 150 to develop a reset pulse which is delivered on line D to reset counters 122, 124, and 126 to restart the temperature display mode period for another 10 second cycle.

Other embodiments will occur to those skilled in the art and are within the following claims:

What is claimed is:

1. An electronic thermometer system for measuring and displaying temperature comprising:
   a first counter for counting pulses representative of the temperature measured;
   a first display device for displaying the count in said first counter;
   a second counter for counting the number of times said first counter completes a count cycle, and for producing a binary coded decimal output;
   a second display device;
   a third display device; and
   a count modifying circuit interconnected between said second counter and said second and third displays responsive to a first predetermined count in said second counter for indicating a first modified pre-established count for display by said second display device and responsive to a second predetermined count in said second counter for indicating a second modified pre-established count for display by said second display device and a third modified pre-established count for display by said third display device, wherein said count modifying circuit includes (i) means for connecting the zero order output of said second counter to the zero order input of said second display device, (ii) an exclusive-OR circuit having two inputs, a first input of said exclusive-OR circuit being connected to the first order output of said second counter and the output of said exclusive-OR circuit being connected to the first order input of said second display device, (iii) an AND-circuit having two inputs, one input of said AND-circuit being connected to the zero order output of said second counter and the other input of said AND-circuit being connected to the first order output of said second counter, the output of said AND-circuit being connected to the third order input of said second display device and to the second input of said exclusive-OR circuit; and (iv) means for connecting the second order output of said second counter to said third display device, said second order input of said second display device being set permanently to binary zero.

2. The system of claim 1 in which said count modifying circuit responds to a third predetermined count in said second counter for indicating a fourth modified preestablished count for display by said second display device and maintains said third modified preestablished count in said third display device.

3. An electronic thermometer system for measuring and displaying temperature comprising:
   a counter for counting pulses representative of the temperature measured;
   a first display device;
   a second display device having a binary coded decimal output; and,
   a count modifying circuit interconnected between said counter and said first and second displays responsive to a first predetermined count in said counter for indicating a first modified pre-established count for display by said first display device and responsive to a second predetermined count in said counter for indicating a second modified pre-established count for display by said first display device and a third modified pre-established count for display by said second display device, wherein said count modifying circuit includes (i) means for connecting the zero order output of said counter to the zero order input of said first display device, (ii) an exclusive-OR circuit having two inputs, a first input of said exclusive-OR circuit being connected to the first order output of said counter and the output of said exclusive-OR circuit being connected to the first order input of said first display device, (iii) an AND circuit having two inputs, a first input of said AND-circuit being connected to the zero order output of said counter and the other input of said AND-circuit being connected to the first order output of said counter, the output of said AND-circuit being connected to the third order input of said first display device and to the second input of said exclusive-OR circuit; and (iv) means for connecting the second order output of said counter to said second display device, said second order input of said first display device being set permanently to binary zero.

4. The system of claim 3 in which said count modifying circuit responds to a third predetermined count in said counter for indicating a fourth modified preestablished count for display by said first display device and maintains said third modified preestablished count in said second display device.

5. In an electronic thermometer system for measuring and displaying time during a time mode period and temperature during a next subsequent temperature mode period, display and display control apparatus comprising:
   (a) first, second, and third display means for displaying progressively more significant digits of time during said time mode and temperature during said temperature mode;
   (b) means for producing pulse signals representative of time increments up to a predetermined maximum time during said time mode and of temperature increments above a datum temperature during said temperature mode, said maximum time and said datum temperature having an identical digit at at least one, common position, said position being represented by said first display means both during time and temperature modes;
   (c) first counter means responsive to pulses from said means for producing, for developing the count displayed at said first display means;
   (d) second counter means for counting the number of times said first counter completes a count cycle, said second counter at least partially developing the count displayed at said second and third display means; and
   (e) logic means, responsive exclusively to the output states of said second counter, for automatically and directly shifting the count displayed at said second display means, from a representation of a digit characterizing said maximum time to a representation of a digit characterizing said datum temperature.

6. Apparatus as described in claim 5 wherein said means for producing includes means for generating a first sequence of pulses respectively representative of predetermined fractions of said maximum time, and means for generating a second sequence of pulses respectively representative of said temperature increments, and wherein said apparatus further includes means, responsive to a count shift energized by said logic means, for coupling said second sequence to said first counter means during the last pulse of said first sequence.

7. Apparatus as described in claim 6 and further including means for disabling said first counter means upon the termination of said last pulse of said first sequence.

* * * * *

UNITED STATES PATENT AND TRADEMARK OFFICE
CERTIFICATE OF CORRECTION

PATENT NO. : 4,090,064
DATED : May 16, 1978
INVENTOR(S) : Robert Bruce Turner

It is certified that error appears in the above-identified patent and that said Letters Patent are hereby corrected as shown below:

In Column 3, line 35, ---temperature--- should read ---temperatures---

In Column 6, line 55, ---resulting a--- should read ---resulting in a ---

In Column 7, line 14, ---Q--- should read ---$\overline{Q}$---

Signed and Sealed this

*Eighth* Day of *May 1979*

[SEAL]

*Attest:*

RUTH C. MASON
*Attesting Officer*

DONALD W. BANNER
*Commissioner of Patents and Trademarks*